(12) United States Patent
Meissner et al.

(10) Patent No.: US 6,488,770 B1
(45) Date of Patent: Dec. 3, 2002

(54) MONOCRYSTALLINE POWDER AND MONOGRAIN MEMBRANE PRODUCTION

(75) Inventors: Dieter Meissner, Linz (AT); Enn Mellikov, Saku (EE); Mare Altosaar, Tallin (EE)

(73) Assignee: Forschungszentrum Jülich GmbH, Jülich (DE)

( * ) Notice: Subject to any disclaimer, the term of this patent is extended or adjusted under 35 U.S.C. 154(b) by 0 days.

(21) Appl. No.: 09/719,036

(22) PCT Filed: Jun. 23, 1999

(86) PCT No.: PCT/DE99/01870

§ 371 (c)(1),
(2), (4) Date: Dec. 6, 2000

(87) PCT Pub. No.: WO99/67449

PCT Pub. Date: Dec. 29, 1999

(30) Foreign Application Priority Data

Jun. 25, 1998 (DE) .......................................... 198 28 310

(51) Int. Cl.$^7$ ................................................. C30B 7/08
(52) U.S. Cl. ............................ 117/73; 117/74; 117/75; 117/77; 117/78
(58) Field of Search ............................... 117/73, 74, 75, 117/77, 78

(56) References Cited

U.S. PATENT DOCUMENTS

| | | | |
|---|---|---|---|
| 3,174,823 A | | 3/1965 | Kopelman |
| 4,721,547 A | * | 1/1988 | Nomura et al. ............. 156/603 |
| 4,921,531 A | | 5/1990 | Nagle et al. |
| 5,436,204 A | * | 7/1995 | Albin et al. ................. 437/225 |
| 5,523,026 A | * | 6/1996 | Chen et al. ................. 252/582 |
| 6,001,748 A | * | 12/1999 | Tanaka et al. ............. 438/791 |

FOREIGN PATENT DOCUMENTS

| | | |
|---|---|---|
| DE | 2 004 339 | 8/1970 |
| EP | 173 641 | 3/1986 |
| WO | WO 89/05280 | 6/1989 |

OTHER PUBLICATIONS

Altosar et al., "Monograin Layers and Membranes for Photovoltaics", *Conf. Record of the 25$^{th}$ IEEE Photovoltaic Specialists Conference*, May 13–17, 1996, 877–880.

T.S. te Velde and G.W.M.T. van Helden, "Monograin Layers", Philips Technical Review, 29 (1968), 238–242.

\* cited by examiner

Primary Examiner—Robert Kunemund
(74) Attorney, Agent, or Firm—Frishauf, Holtz, Goodman & Chick, P.C.

(57) ABSTRACT

For production of monocrystalline powders there is formed a melt to which a fluxing agent is added. The melt contains the components of a semiconductor material, an example being the components of copper indium diselenide which are generally used in a stoichiometric composition. The melt is usually heated to temperatures of between 300° C. and 1000° C. Monocrystalline powder grains grow. The desired recrystallization takes place at temperatures above the melting points of the materials to be fused. Once the powder grains have the desired size, the growth is stopped by quenching. The appropriate instant of quenching as well as the appropriate temperature profile for obtaining desired powder sizes are determined by, for example, preliminary experiments. Thereafter the fluxing agent is eliminated. Monograin membranes are produced from the powders produced according to the process and are used in particular in solar cells. The process is simple and inexpensive. Powder grains of uniform size are obtained.

14 Claims, No Drawings

MONOCRYSTALLINE POWDER AND MONOGRAIN MEMBRANE PRODUCTION

CROSS REFERENCE TO RELATED APPLICATION

This application is a U.S. National Phase Application under 35 USC 371 of International Application PCT/DE99/01870 (not published in English) filed Jun. 23, 1999.

BACKGROUND OF THE INVENTION

Field of the Invention

The invention relates to a process for production of monocrystalline powders and a monogram membrane comprising the same.

BACKGROUND INFORMATION

A monogram membrane is a thin film constructed from one layer of powder. The powder grains are bonded together.

From the article entitled "Monograin layers" by T. S. Velde and G. W. M. T. van Helden in Philips Technical Review, 29 (1968), 238–242, it is known that a monogram membrane can be produced from monocrystalline CdS powder. Monocrystalline powder comprising CdS is obtained by crushing a relatively large single crystal. A bonding agent is then applied as a thin film on a glass substrate. The powder is scattered on the film of the bonding agent. Thereupon a layer of the powder adheres to the bonding agent. The other powder grains not attached to the bonding agent are eliminated. Dissolved resin, polymer or components for the same are added to the powder grains adhering to the bonding agent. After the solution has been dried and cured, the film containing a powder layer is peeled from the substrate. If necessary, the powder grains can be exposed by etching, starting from the surface. Otherwise the powder grains are or remain held together by the resin, etc. and thus form the desired monogram membrane.

One problem is the production of the monocrystalline powder. For example, it is relatively expensive first of all to produce a relatively large single crystal. It is also hardly possible to produce powder grains of uniform size by mechanical crushing.

Powder grains of uniform size are necessary in order to obtain a monogram membrane of uniform thickness.

A monogram membrane can be used advantageously in the art of photovoltaics, among others. Copper indium diselenide is a particularly suitable material for this purpose.

SUMMARY OF THE INVENTION

The object of the invention is to provide an inexpensive process for production of monocrystalline powder with predetermined grain sizes. A further object of the invention is to provide, for the first time, particular monogram membranes comprising powders formed according to the process.

The objects are achieved by a process having the features described hereinbelow as well as by a monogram membrane having the features described hereinbelow. Advantageous embodiments are specified hereinbelow.

The present invention concerns a process for producing a monocrystalline powder comprising a semiconductor material. The process comprises:

(a) fusing together individual components of the semiconductor material or salts thereof to form a melt;

(b) adding a fluxing agent to the melt;

(c) adjusting the temperature of the melt together with the fluxing agent such that the components or salts thereof melt and at the same time the powder to be produced crystallizes out, so that monocrystalline powder grains grow; and (d) cooling the melt such that the growth of the monocrystalline powder grains is stopped.

The present invention also relates to a monogram membrane comprising monocrystalline copper indium diselenide or GaAs grains produced according to the above-described process.

DETAILED DESCRIPTION OF THE INVENTION

According to the process, a melt is formed and a fluxing agent is added. The melt is formed from the individual components of a semiconductor material, preferably a II/VI or III/V semiconductor, an example of which can therefore be the components of copper indium diselenide or GaAs. Salts containing the components can also be fused instead of the components. The components or their salts are preferably chosen such that the components are present in the melt in the same stoichiometric composition as that of the powder to be produced.

The melt must then be brought to a temperature at which the individual components or their salts become fused and at the same time the powder to be produced crystallizes out. Such a temperature typically lies between 300° C. and 1000° C. In the appropriate temperature range, monocrystalline powder grains are formed in the melt. Once the powder grains have reached the desired size, the melt is cooled or quenched so rapidly that the growth of the powder grains is stopped as a result. The appropriate instant of quenching, as well as the appropriate temperature profile for obtaining desired powder sizes are determined by, for example, preliminary experiments. After quenching or cooling it is expedient to eliminate the fluxing agent.

The process is simple and inexpensive, since it is not necessary to produce large single crystals beforehand. The grains grow uniformly, and so the resulting powder comprises grains of uniform size.

To produce copper indium diselenide monocrystalline powder, the salt melt can be formed from CuSe and In, or from Cu, Se and In, or from Cu—In alloys and Se, or from Cu, In or Se salts with appropriate melting points. A typical melt then has the composition of, for example, 6.35 g Cu, 11.5 g In, 15.8 g Se and 40 vol % CuSe.

NaCl or an excess of Se or selenides can be used as a fluxing agent in a melt containing copper indium diselenide. The proportion of fluxing agent typically amounts to 40 vol % of the melt. In general, however, it can range between 10 vol % and 90 vol %. The melt together with the fluxing agent is introduced into, for example, a quartz ampoule. The quartz ampoule is evacuated and fused. Thereafter the quartz ampoule together with the contents cited as an example is heated to at least 300° C., especially 600° C. As soon as the components have melted, monocrystalline copper indium diselenide grains begin to grow. The growth of a semiconductor such as copper indium diselenide takes place as a function of time and of the fluxing agent used. Depending on fluxing agent and desired size of the powder grains, a treatment time ranging from 5 minutes to 100 hours is necessary.

In order to stop the growth selectively, the melt is cooled. The cooling rate determines the fault content and fault type in the material, as well as the surface morphology. Quenching can be completed within a few seconds. The melt can also be cooled over a period of several hours. For this purpose the quartz ampoule together with the contents can be cooled in a water bath or in air at an instant determined by preliminary experiments. Thereafter the contents are removed from the quartz ampoule and the fluxing agent is eliminated. In the case of NaCl, this can be achieved, for example, by dissolving the NaCl in water, provided the powder grains are insoluble in water, as is the case of copper indium diselenide. If Se is used as the fluxing agent, it can be eliminated by volatilization of Se.

The temperature range in which recrystallization takes place depends on the fluxing agent and the desired grain size, and can lie between 100° C. and 1000° C. The process has been used to produce, among other substances, monocrystalline copper indium diselenide powder with extremely high electrical conductivity. Grain diameters of 40 µm, for example, have been obtained. Grains with resistance of 10 to 30Ω have been achieved. These values correspond to specific electrical resistivities of 0.1 to 0.6 Ωm.

It was possible to produce powders with diameters of 0.1 µm to 0.1 mm.

From the powders produced according to the process, there can be produced by the prior art described hereinabove in the background of the invention monogram membranes which can be used, for example, in photovoltaics. A minimum diameter of 10 µm was necessary for production of monogram membranes, since otherwise a continuous polymer film was not possible. A diameter of 50 µm should not be exceeded for the production of monogram membranes, since otherwise, in the art of photovoltaics, for example, undesirably high series resistances develop and material is wasted. It is worth emphasizing that the grain sizes produced according to the process vary only slightly within a batch.

Further examples of semiconductor materials from which monocrystalline powders can be produced according to the process are CdTe, CdSeTe, CdS, CdSSeTe, GaAs, InP.

What is claimed is:

1. A process for production of a monocrystalline powder comprising a semiconductor material, the process comprising:
   (a) fusing together individual components of the semiconductor material or salts of the components to form a melt,
   (b) adding a fluxing agent to the melt,
   (c) adjusting the temperature of the melt together with the fluxing agent contained therein such that the components or their salts melt and at the same time the powder to be produced crystallizes out, so that monocrystalline powder grains grow, and
   (d) cooling the melt by rapidly quenching the melt such that the growth of the monocrystalline powder grains is stopped.

2. The process according to claim 1, wherein the fluxing agent is eliminated after the cooling.

3. The process according to claim 1, wherein the fluxing agent is selected from the group consisting of NaCl, Se, As, an arsenide and a selenide.

4. The process according to claim 1, wherein the fluxing agent is contained in the melt in a proportion of 10 vol % to 90 vol %.

5. The process according to claim 1, wherein the semiconductor material comprises a Group II/VI semiconductor or a Group III/V semiconductor.

6. The process according to claim 2, wherein the fluxing agent is selected from the group consisting of NaCl, Se, As, an arsenide and a selenide.

7. The process according to claim 2, wherein the fluxing agent is contained in the melt in a proportion of 10 to 90 vol %.

8. The process according to claim 3, wherein the fluxing agent is contained in the melt in a proportion of 10 to 90 vol %.

9. The process according to claim 6, wherein the fluxing agent is contained in the melt in a proportion of 10 to 90 vol %.

10. The process according to claim 2, wherein the semiconductor material comprises a Group II/VI semiconductor or a Group III/V semiconductor.

11. The process according to claim 2, wherein the semiconductor material comprises copper indium diselenide or GaAs.

12. The process according to claim 11, wherein in step (b), the temperature is 300° C. to 1000° C.

13. The process according to claim 1, wherein the semiconductor material is selected from the group consisting of CdTe, CdSeTe, CdS, CdSSeTe, GaAs, InP and CuSeIn.

14. The process of claim 1, wherein the quenching is carried out in a few seconds.

* * * * *